(12) United States Patent
Rhodes et al.

(10) Patent No.: US 7,965,136 B2
(45) Date of Patent: Jun. 21, 2011

(54) MULTIPORT AMPLIFIER ADJUSTMENT

(75) Inventors: Geoffrey Philip Rhodes, Hitchin (GB);
Michael Harverson, Potton (GB)

(73) Assignee: Astrium Limited, Stevenage, Hertfordshire (GB)

( * ) Notice: Subject to any disclaimer, the term of this patent is extended or adjusted under 35 U.S.C. 154(b) by 0 days.

(21) Appl. No.: 12/379,650

(22) Filed: Feb. 26, 2009

(65) Prior Publication Data

US 2010/0148860 A1 Jun. 17, 2010

(30) Foreign Application Priority Data

Dec. 12, 2008 (GB) .................................. 0822659.9

(51) Int. Cl.
*G01R 19/00* (2006.01)
(52) U.S. Cl. ........................................ 330/2; 330/124 R
(58) Field of Classification Search .......... 330/2, 124 R, 330/295, 84, 126
See application file for complete search history.

(56) References Cited

U.S. PATENT DOCUMENTS

| | | | |
|---|---|---|---|
| 5,675,285 A | | 10/1997 | Winters |
| 6,006,111 A | * | 12/1999 | Rowland ....................... 455/561 |
| 6,049,707 A | * | 4/2000 | Buer et al. .................... 455/314 |
| 6,069,525 A | * | 5/2000 | Sevic et al. .................... 330/51 |
| 6,662,018 B1 | * | 12/2003 | Kintis et al. ................... 455/522 |
| 7,088,173 B1 | | 8/2006 | Rozario et al. |
| 2003/0214355 A1 | | 11/2003 | Luz et al. |
| 2008/0039024 A1 | | 2/2008 | Ikeda et al. |

FOREIGN PATENT DOCUMENTS

| | | |
|---|---|---|
| EP | 1 152 523 | 11/2001 |
| EP | 1 394 954 | 3/2004 |
| EP | 2 073 381 | 6/2009 |
| WO | WO 2008/135753 | 11/2008 |
| WO | WO 2009/080752 | 7/2009 |

OTHER PUBLICATIONS

UK Search Report dated Apr. 24, 2009 for GB 0822659.9, 3 pages.
UK Search Report dated Jul. 9, 2009 for GB 0822659.9, 3 pages.
International Search Report and Written Opinion of the International Searching Authority dated May 21, 2010 for PCT/EP2009/066868.
C.G. Niederstrasser et al, "Design and Performance Testing of a Satellite Health Beacon Receiving Station" Aerospace Conference, 1999, pp. 241-251.

* cited by examiner

*Primary Examiner* — Henry K Choe
(74) *Attorney, Agent, or Firm* — Nixon & Vanderhye P.C.

(57) ABSTRACT

The invention provides a method and apparatus for applying test signals to a multiport amplifier (MPA) and a method, apparatus and system for determining parameter adjustments for an MPA. Applying test signals to an MPA is performed so as to provide an output signal indicative of parameter adjustments for the MPA, the multiport amplifier arrangement comprising an input network, an amplifier unit and an output network, where the method includes providing a test signal directly to a point in the multiport amplifier arrangement between an output of the input network and an input of the amplifier unit. The method of determining parameter adjustments for a multiport amplifier arrangement includes receiving first and second output signals associated with an output of the multiport amplifier arrangement, the first output signal corresponding to a first signal path through the multiport amplifier arrangement and the second output signal corresponding to a second signal path through the multiport amplifier arrangement and determining parameter adjustments based on the first and second output signals.

24 Claims, 8 Drawing Sheets

MULTIPORT AMPLIFIER ADJUSTMENT

CROSS REFERENCE TO RELATED APPLICATION

This application claims benefit of British Patent Application No. 0822659.9 filed 12 Dec. 2008, incorporated herein by reference in its entirety.

The invention relates to multiport amplifier (MPA) adjustment, particularly but not exclusively to a method and apparatus for applying test signals to a satellite-based MPA and a method and system for determining adjustments for use in the alignment of the gain and phase characteristics of an MPA.

An MPA is a well-known power amplifier device used for communications such as satellite communications. MPAs are generally operated at microwave frequencies above 1 GHz, for instance L & S bands with frequencies in the range 1.5 to 2.6 GHz, and Ku & Ka bands with frequencies in the region of 12 to 20 GHz, etc.

An MPA includes a number N of similar amplifier units, for instance travelling wave tube (TWT) or solid state amplifiers, arranged in parallel, each having a power P, so that each input signal is amplified by each amplifier. N input ports and N output ports are provided, so that an input signal on one input port is routed to the corresponding output port. The input ports are connected to the amplifier units by a low power input network (INET) that may be implemented in any convenient transmission line technology that is appropriate to the circumstances, e.g. microstrip, stripline, coaxial cable, or waveguide. The output ports are connected to the amplifier units by a high power output network (ONET) that is implemented typically using low loss transmission line technology.

The ONET is mathematically a reciprocal of the INET, so that a signal presented to the nth input is directed to the nth output. Each network comprises an array of signal dividing waveguide devices. A Butler matrix or a network comprising just hybrid devices is normally used for signal division, because such arrangements have convenient gain and phase shift properties. One type of hybrid is a four port signal dividing device comprising two inputs and two outputs, with selective 90° phase shifts; this phase difference may be exploited to improve the isolation characteristics of the networks. However other hybrids and other signal splitting devices may be used which may have 180° phase difference.

A problem which can arise in the provision of MPAs, for instance those arranged to operate at frequencies in the Ku and/or Ka band, is that of phase and amplitude tracking between the amplifiers and other units at the frequencies concerned (12 GHz at Ku, 20 GHz at Ka-band). If the performances of the MPA's constituent parts were stable over time then a multi-port amplifier could be aligned on ground and its performance could be expected to remain constant over the satellite lifetime. However, whilst some components are expected to be stable, there is considerable uncertainty over the stability of the high power amplifiers. It is expected that daily variations in performance will be manageable without recalibration, but some adjustment will be required during the satellite lifetime to compensate for the long term drift of the amplifier performance (which is not well quantified) and to correct imbalances in the gain and phase matching of the MPA, for instance caused by redundancy switching in the event of one or more TWTA failures during the satellite lifetime.

In view of this uncertainty it is prudent to provide a means to calibrate the MPA in orbit. The purpose of the calibration system is to compensate for any changes in the differential performance of the amplifiers within a single MPA over the satellite lifetime. If the performance of each of the amplifiers is not well matched the result will be imperfect MPA port-to-port isolation and, as a consequence, interference between the signals processed by the MPA.

Several MPA calibration techniques exist based on on-board generation and monitoring of test signals. The test signals are typically injected into the MPA INET inputs and monitored at the MPA ONET outputs. The measured characteristics of the output signal are used to provide an estimate of the gain and phase adjustments required to minimise unwanted signal levels at the outputs of the MPA. The gain and phase adjustments are effected by adjustable gain and phase shifters located at the inputs to the travelling wave tube amplifiers (TWTAs).

In general two types of on-board equipment are required, a test signal generator and test signal measurement equipment. The detailed design of each type of equipment will be determined by the selected MPA calibration method. Estimation of the gain and phase adjustment values will most likely be performed on the ground based on the results of measurements made on board and communicated to the ground via the standard telemetry link. The systems usually employ a single test signal (tone) injected at one of the MPA INET input ports. All MPA inputs are exercised in sequence using switches to redirect the test signal to each input in turn.

Measurements are typically performed on the corresponding signals appearing at the MPA ONET output ports. The measurements are performed in sequence using a similar switch network to that at the input in order to direct the test signal from each MPA output to the measurement equipment.

In known MPA calibration techniques, very accurate gain and phase measurements at the output ports of the ONET are required in order to determine the precise gain and phase shifts applied by the MPA to the input signals. This requires highly accurate signal generation and measurement to detect any calibration errors in the MPA.

In terms of satellite-based MPAs, it is generally desirable for cost and complexity reasons to minimise the amount of testing required to calibrate the MPA and to simplify those tests where possible, as well as minimising the amount of on-board hardware dedicated to the MPA calibration function.

The present invention aims to provide an improved system and method for applying test signals to a multiport amplifier arrangement and for determining parameter adjustments for the multiport amplifier arrangement.

According to the invention, there is provided a method of applying test signals to a multiport amplifier arrangement so as to provide an output signal indicative of parameter adjustments for the multiport amplifier arrangement, the multiport amplifier arrangement comprising an input network, an amplifier unit and an output network, the method comprising providing a test signal directly to a point in the multiport amplifier arrangement between an output of the input network and an input of the amplifier unit.

By providing a test signal directly to a point between the input network and an input of the amplifier unit, an output corresponding to the test signal will appear at each of the outputs of the MPA. This enables the test signal to be measured at any of the outputs of the MPA. Furthermore, the specific path of the test signal through the amplifier unit can be determined, since the test signal can be provided to only a subset, for instance one, of the amplifiers in the amplifier unit, rather than to each of the amplifiers, allowing the calibration of the parameters of a specific amplifier corresponding to that test signal and simplifying the testing process.

Providing a test signal can further comprise providing a first test signal to a first point in the multiport amplifier arrangement between an output of the input network and a first input of the amplifier unit and providing a second test signal at a second point in the multiport amplifier arrangement between an output of the input network and a second input of the amplifier unit. In this manner, two test paths though the MPA can be compared.

The second test signal can be provided to the second point in the multiport amplifier arrangement simultaneously to the first test signal being provided to the first point. An output signal provided at one of the output ports of the MPA arrangement can accordingly be tested to determine calibration that may be required between the path from the first input of the amplifier unit to the output port and the path from the second input of the amplifier unit to the output port.

According to the invention, there is also provided a method of determining parameter adjustments for a multiport amplifier arrangement in a communication system, the method comprising receiving first and second output signals associated with an output of the multiport amplifier arrangement, the first output signal corresponding to a first signal path through the multiport amplifier arrangement and the second output signal corresponding to a second signal path through the multiport amplifier arrangement and determining parameter adjustments for the multiport amplifier arrangement based on the first and second output signals.

The multiport amplifier arrangement can comprise an input network, an amplifier unit and an output network and the method can further comprise providing a first test signal at a first point in the multiport amplifier arrangement between an output of the input network and a first input of the amplifier unit, the first test signal corresponding to the first output signal and providing a second test signal at a second point in the multiport amplifier arrangement between an output of the input network and a second input of the amplifier unit, the second test signal corresponding to the second output signal.

The second test signal can be provided to the second point in the multiport amplifier arrangement simultaneously to the first test signal being provided to the first point.

The parameter adjustments can be at least one selected from gain adjustments and phase adjustments of the amplifier arrangement.

The path of the first test signal through the multiport amplifier arrangement can act as a reference path and the path of the second test signal through the multiport amplifier arrangement can act as a calibration path, wherein the step of determining parameter adjustments comprises determining parameter adjustments for the calibration path through the multiport amplifier arrangement.

The method can further comprise determining values indicative of the gain and phase shift of the calibration path relative to the reference path.

The method can further comprise providing said first test signal at the first point in the multiport amplifier arrangement and providing said second test signal at a further point in the multiport amplifier arrangement between an output of the input network and a respective one of each of a plurality of inputs of the amplifier unit other than the first and second inputs.

The first and second test signals can comprise tones.

The first test signal can comprise the sum of a carrier component of an amplitude modulated signal and a first sideband component of the amplitude modulated signal and the second test signal can comprise a second sideband component of the amplitude modulated signal.

The first test signal can comprise a carrier component of an amplitude modulated signal and the second test signal can comprise one or both sideband components of the amplitude modulated signal.

The method can further comprise applying said first and second test signals to the first point in the multiport amplifier arrangement in a first phase of a test sequence, wherein the first and second test signals are provided to the MPA at the first and second points in the multiport amplifier arrangement in a second phase of the test sequence.

The method can further comprise measuring the amplitude of said second output signal corresponding to said second test signal during the first phase of the test sequence.

The method can further comprise transmitting the output of the multiport amplifier arrangement over a communications channel of the communications system and receiving and analysing the transmitted output to determine parameter parameters for the calibration path through the multiport amplifier arrangement.

The communication system can comprise a satellite communication system, the multiport amplifier arrangement being located onboard the satellite and the steps of receiving and analysing the transmitted output of the multiport amplifier being performed at a ground-based location.

According to the invention there is also provided an apparatus for applying test signals to a multiport amplifier arrangement so as to provide an output signal indicative of parameter adjustments for the multiport amplifier arrangement, the multiport amplifier arrangement comprising an input network, an amplifier unit and an output network, the apparatus comprising a test signal applying unit for providing a test signal directly to a point in the multiport amplifier arrangement between an output of the input network and an input of the amplifier unit.

The test signal applying unit can be arranged to provide a first test signal to a first point in the multiport amplifier arrangement between an output of the input network and a first input of the amplifier unit and provide a second test signal at a second point in the multiport amplifier arrangement between an output of the input network and a second input of the amplifier unit.

The test signal applying unit can be arranged to apply the second test signal to the second point in the multiport amplifier arrangement simultaneously to the first test signal being provided to the first point.

The test signal applying unit can comprise a switch unit arranged to provide said second test signal at a point in the multiport amplifier arrangement between an output of the input network and a respective one of each of the second and a plurality of further inputs of the amplifier unit.

The apparatus can be arranged for use in a satellite communication system.

The test signal applying unit can includes an earth station antenna tracking beacon generator.

According to the invention, there is also provided a system for determining parameter adjustments for a multiport amplifier arrangement arranged for use in a communication system, the multiport amplifier arrangement comprising an input network, an amplifier unit and an output network, the system comprising an apparatus according to the invention and an adjustment calculation unit for determining parameter adjustments for the multiport amplifier arrangement based on an output of the multiport amplifier arrangement.

The system can further comprise a signal measurement unit and an adjustment calculation unit, wherein the signal measurement unit is arranged to receive and measure the first and second output signals and to provide an output to the adjustment calculation unit, and wherein the adjustment calculation unit is arranged to calculate the parameter adjustments based on the output from the signal measuring unit.

The signal measurement unit comprises at least one selected from an adapted commercial satellite beacon receiver and an adapted spectrum analyser.

According to the invention, there is also provided an apparatus for determining parameter adjustments for a multiport amplifier arrangement in a communication system, the apparatus comprising a signal measuring unit for receiving first and second output signals associated with an output of the multiport amplifier arrangement, the first output signal corresponding to a first signal path through the multiport amplifier arrangement and the second output signal corresponding to a second signal path through the multiport amplifier arrangement and an adjustment calculation unit for determining parameter adjustments for the multiport amplifier arrangement based on the first and second output signals.

Embodiments of the invention will now be described, by way of example, with reference to the accompanying drawings, in which.

Figure 1:
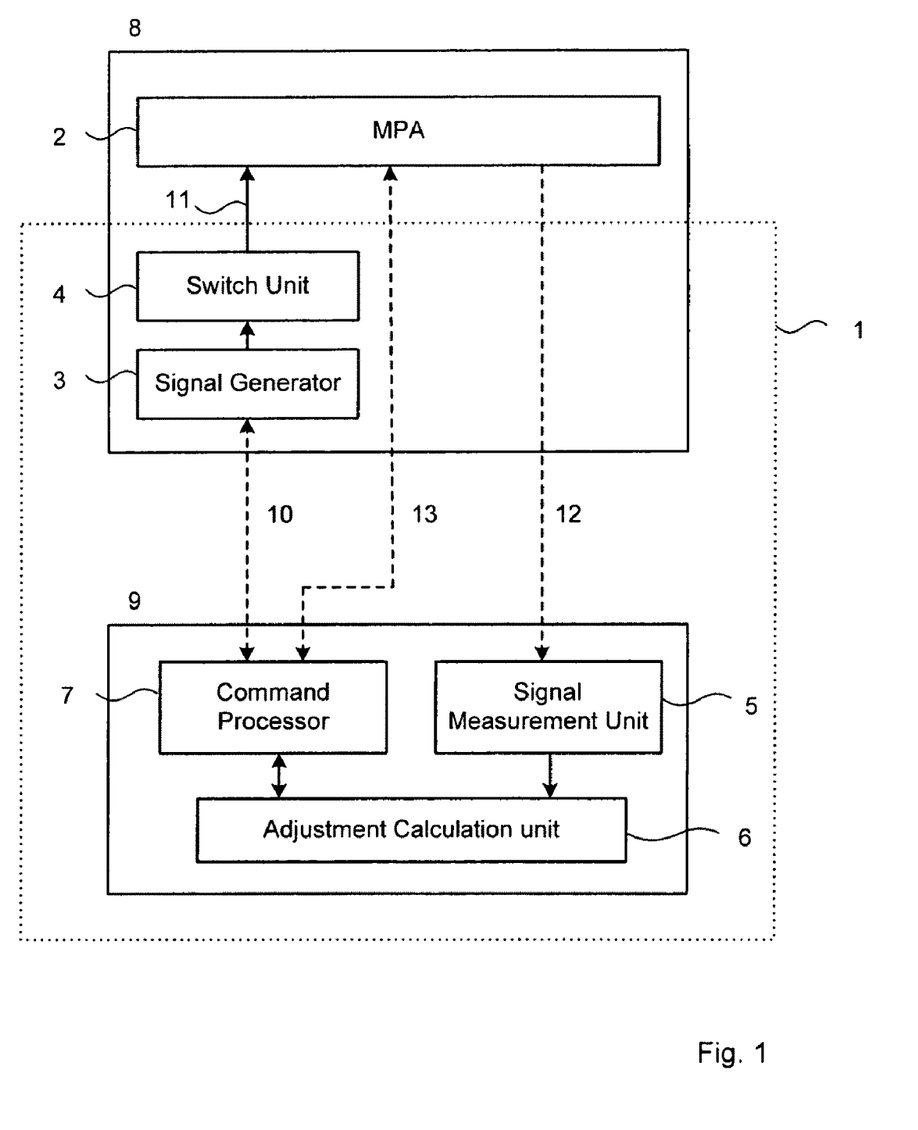
FIG. 1 schematically illustrates a system for applying test signals to a multiport amplifier and for determining parameter adjustments for the multiport amplifier according to an embodiment of the present invention.

Referring to FIG. 1, a system 1 for applying test signals to a multiport amplifier arrangement 2 and for determining parameter adjustments for the multiport amplifier arrangement 2 includes a signal generator 3, switch unit 4, signal measurement unit 5, an MPA adjustment calculation unit 6 and a command processor 7. In the present example, the multiport amplifier arrangement 2, signal generator 3 and switch unit 4 are located on-board a communications satellite 8, the MPA arrangement 2 used to provide antenna feeds forming downlink communication channels from the satellite 8. The signal measurement unit 5, MPA adjustment calculation unit 6 and command processor 7 are located at a control station 9, in the present example a satellite communications ground station.

In use, the command processor 7 provides a first command signal via a first command signal channel 10 to the signal generator 3 instructing the signal generator 3 to provide a test signal to the MPA arrangement 2. An output of the signal generator 3 is provided to the switch unit 4 and in turn to the MPA arrangement 2, via a connection 11 between the switch unit 4 and the MPA arrangement 2. The signal generator 3, switch unit 4 and connection 11 are referred to herein as a test signal applying unit. An output of the MPA arrangement 2 is transmitted to the signal measurement unit 5 via a communications signal path 12 and, based on the received signal, MPA parameter adjustments are calculated by the adjustment calculation unit 6 for use in calibrating the MPA arrangement 2. The calculated adjustments are provided to the command processor 7 which provides a second command signal via a second command signal channel 13 to the MPA arrangement 2 to adjust parameters of and thereby calibrate the MPA 2. Further information is also provided, in the present example, to the command processor 7 via the respective first and second command signal channels 10, 13, for use by the adjustment calculation unit 6 in calculating MPA adjustments. In the present case, this is information indicating the MPA parameters currently in use by the MPA 2, although the information can also include information regarding the signals generated by the signal generator 3.

Figure 2:
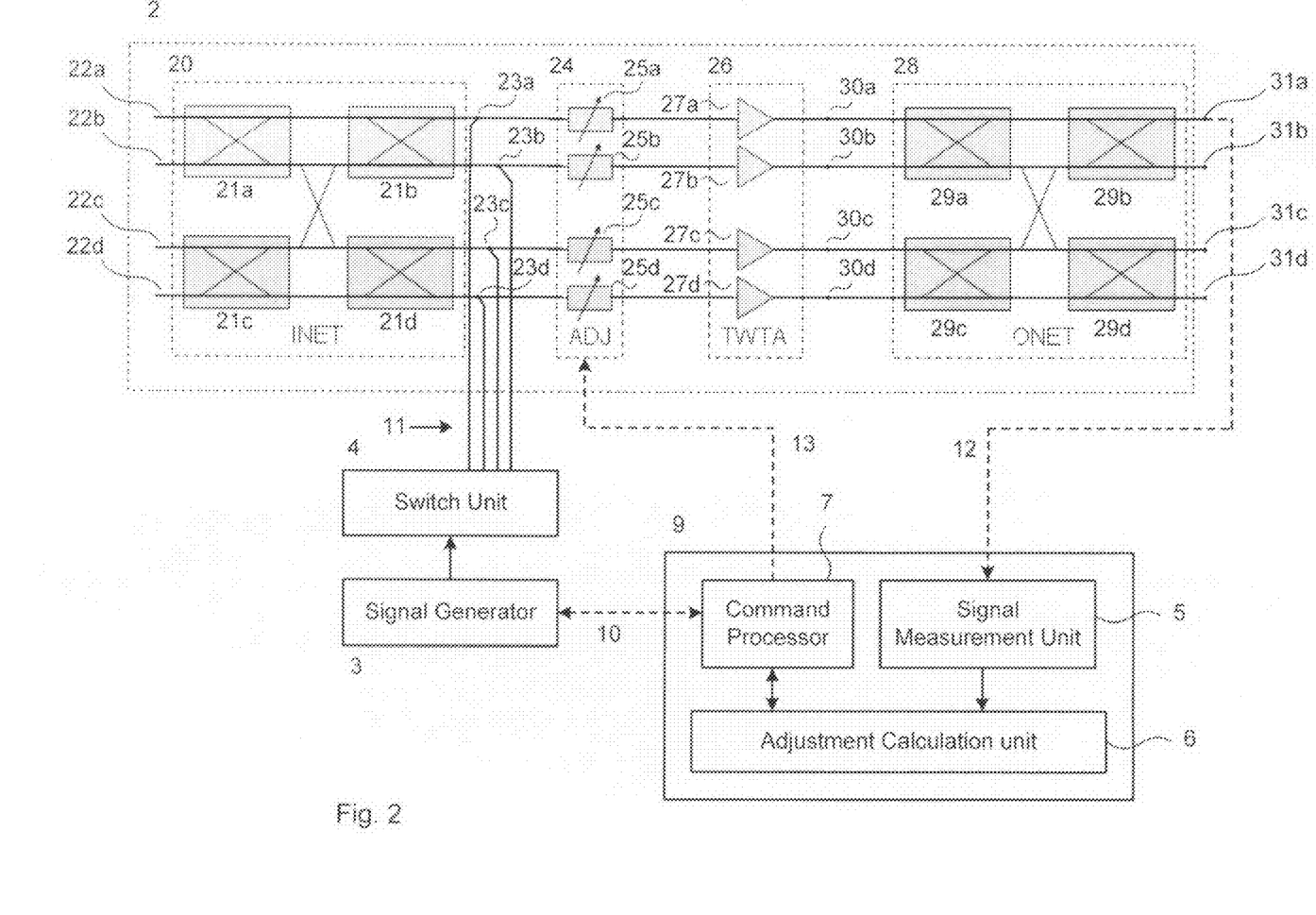
FIG. 2 schematically illustrates the system of FIG. 1 in more detail.

FIG. 2 schematically illustrates the system of FIG. 1 in more detail.

Referring to FIG. 2, the MPA arrangement 2 comprises a 4-port MPA having an input network (INET) 20 including four input signal dividing waveguide devices 21a-d, in the present example hybrid elements. The INET 20 has four INET input ports 22a-d and four INET output nodes 23a-d. The MPA arrangement 2 also includes a programmable amplitude and phase adjuster arrangement 24 having four adjustment units 25a-d, an amplifier arrangement 26 having four amplifiers 27a-d, in the present example travelling wave tube amplifiers (TWTAs), and an output network (ONET) 28 having four output signal dividing waveguide devices 29a-d, in the present example hybrid elements. The ONET 28 has four ONET input nodes 30a-d and four ONET output ports 31a-d.

The TWTAs 27a-d are, in the present example, high power linearised travelling wave tube (TWT) amplifiers. The lineariser (not shown) for each TWT is precisely matched to the particular TWT device, and is located in the signal path just prior to the input of its corresponding TWT. The channel amplifier (CAMP, not shown) is located outside of the MPA arrangement 2 at a point prior to the MPA inputs 22a-d.

The invention is not limited to the use of linearised TWTAs 27a-d, but can be used with other amplifiers, for instance standard TWTAs or other amplifiers, for instance selected according to the frequencies at which the MPA arrangement 2 is arranged to operate.

Each INET output node 23a-d is connected to a respective one of the adjustment units 25a-d and each respective adjustment unit 25a-d is used to adjust the gain and phase characteristics of a respective one of the TWTAs 27a-d. The present example employs electronic gain and phase adjusters operating at the downlink RF frequency (e.g. 20 GHz for a Ka-band MPA) and physically accommodated within the same housing as the TWT lineariser (not shown). Gain and phase adjustment is effected by the second command signal transmitted from the command processor 7 over the second command signal channel 13, individually adjusting each TWTA device 27a-d. The second command signal is a telecommand signal, as known to those skilled in the art, used for controlling functions of the satellite 8. The output of each amplifier 27a-d is connected to a respective one of the ONET input nodes 30a-d.

In alternative embodiments, it is possible to control the gain and phase shift of each of the TWTA devices 27a-d by varying the voltages generated by their power supplies (e.g. electronic power conditioners EPCS). This would require adapted EPCs, the design requirements for which would be evident to those skilled in the art.

The signal measurement unit 5 is arranged to receive the transmitted signal 12 as a satellite downlink channel provided by an antenna feed output from a first output port 31a of the ONET output ports 31a-d.

In use, the signal generator 3 outputs test signals, in the present example a reference signal 'R' and a calibration signal 'C', where the relative gain and phase characteristics of the reference and calibration signals are known. The reference signal R is applied, via the switch unit 4, to a first one of the INET output nodes 23a-d and the path between this port and the output of the MPA arrangement 2 at the first ONET output port 31a acts as a reference path. The switch unit 4 applies the calibration signal 'C' to each of the remaining output nodes 23a-d of the INET 20 corresponding to signal paths through the MPA arrangement 2 that are to be calibrated with the reference path. In this manner, a test sequence having N−1 steps can be implemented, where N is the number of ports of the MPA 2. For instance, in the present example, the reference signal can be applied to the first INET output node 23a resulting in a reference path and calibration test signals can be applied to each of the three remaining INET output nodes 23b-d, for calibrating the paths corresponding to those nodes 23b-d with the reference path.

The paths from the signal generator output(s) to the MPA arrangement can be partially or fully gain and phase-matched, including any associated intermediate switching. The precise requirements for path alignment will depend upon the details of the selected calibration scheme. The interface between the signal generator 3 and the INET output nodes 23a-d is an RF interface.

The reference and calibration signals R, C, propagate through the relevant adjustment units 25a-d, amplifiers 27a-d and the ONET 28 and are combined and output at each of the ONET output ports 31a-d. Since the ONET 28 is arranged to divide the outputs of the TWTAs 27a-d back into their constituent channels, when both the reference and calibrations signals are applied to the MPA 2, a combination of the reference and calibration signals will be provided at each of the ONET output ports 31a-d.

The signal measurement unit 5 receives and analyses the combined MPA output, in the present example the output from the first ONET output port 31a, in order to determine any gain and/or phase shift between the reference and calibration signals R, C. The paths that the reference and calibration signals take from the INET output nodes 23a-d to the measurement unit 5 are essentially equivalent, with the exception of the particular adjustment unit 25a-d, TWT 27a-d and particular path through the ONET 28. Since the characteristics of the ONET 28 are known, any relative differences between the phase and gain of the calibration path in relation to the reference path will result from a calibration between the paths which can be compensated for using the adjustment units 25a-d. The signal output from any of the ONET output ports 31a-d can be measured by the signal measurement unit 5.

Based on the result of the measurements preformed at the signal measurement unit 5, the adjustment calculation unit 6 calculates parameters for adjusting the phase and gain characteristics of the amplifiers 27a-d in order to improve the port-to-port isolation performance of the MPA arrangement 2. The adjustment calculation unit 6 accepts measured performance data from the signal measurement unit 5 and information on the current gain and phase settings obtained via the command processor 7, as well as any other equipment status information that may be required. The calculated parameters are applied to the programmable amplitude and phase adjuster arrangement 24 onboard the satellite 8 via the second command signal channel 13 to adjust the gain and phase characteristics of the calibration path.

Figure 3:
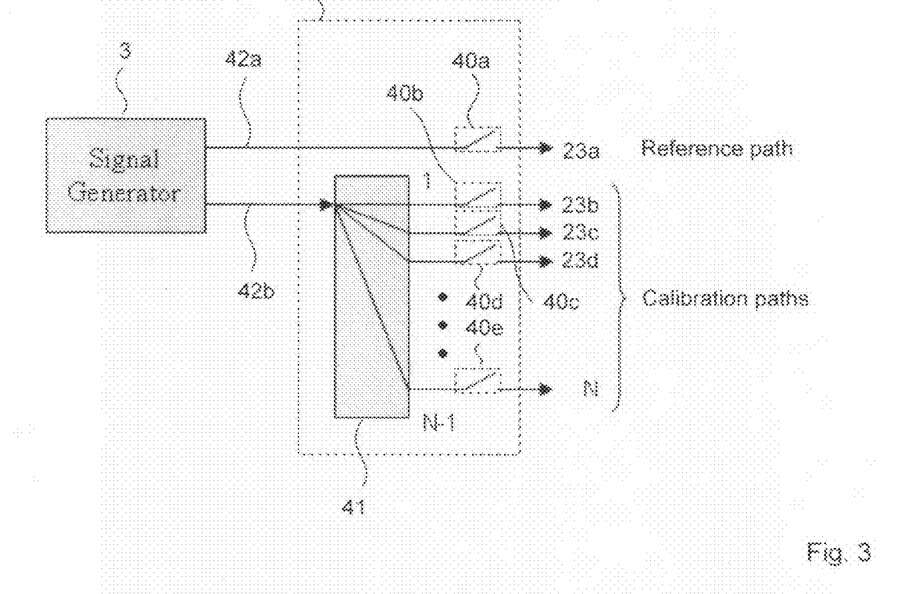
FIG. 3 schematically illustrates functional components of a switch unit forming part of the system of FIGS. 1 and 2, according to an embodiment of the invention.

FIG. 3 schematically illustrates functional components of the switch unit 4 according to an embodiment of the invention.

Referring to FIG. 3, the switch unit 4 includes first, second, third, fourth and $N^{th}$ switches 40a-e, each corresponding to an output node 23a-d of the INET 20, where N is the number of ports of the MPA arrangement 2. In the present example in which a 4-port MPA is used having four INET output nodes 23a-d, the first to fourth switches 40a-d are provided. The switch unit 4 also includes a signal splitter 41 for providing an input signal to each of N−1 outputs. A first output from the signal generator 3, corresponding to the reference test signal 'R' is applied via a first connection 42a to the switch unit 4, and is applied to an input of the first switch 40a. The output of the first switch 40a is connected to the first INET output node 23a. A second output from the signal generator 3, corresponding to the calibration signal 'C', is applied via a second connection 42b to an input of the signal splitter 41. The N−1 outputs of the signal splitter 41 are provided to the respective inputs of the second to $N^{th}$ switches 40b-e, in the present case the second, third and fourth switches 40b-d, the outputs of which are in turn connected to the respective second, third, fourth and $N^{th}$ INET output nodes, in the present case the second, third and fourth INET output nodes 23b-d.

Therefore, referring to FIG. 2, to calibrate the path through the MPA arrangement 2 corresponding to the second amplifier 27b with respect to the path corresponding to the first amplifier 27a, the first switch 40a of the switch unit 4 is closed such that the reference signal R is provided as the first output 42a from the signal generator 3 to the first INET output node 23a and the second switch 40b of the switch unit 4 is closed and the remaining third and fourth switches 40c, 40d are left open such that the calibration signal C is provided as the second output 42b from the signal generator 3 to the second INET output node 23b.

Figure 4:
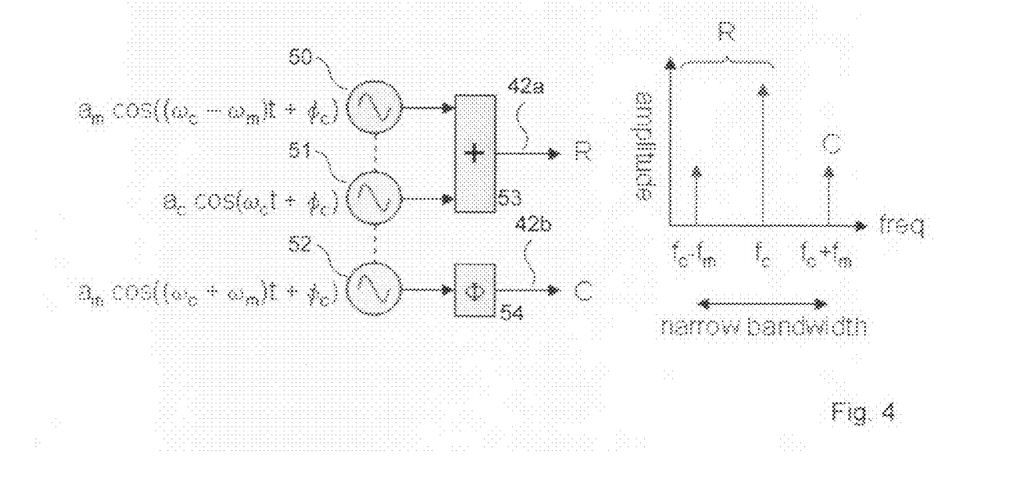
FIG. 4 schematically illustrates functional components of a signal generator forming part of the system illustrated in FIGS. 1 and 2, arranged for use with the switch unit of FIG. 3, as well as graphical illustrations of the signals generated by the signal generator, according to an embodiment of the invention.

FIG. 4 schematically illustrates the components of the signal generator 3 used to generate the reference and calibration signals according to an embodiment of the invention.

Referring to FIG. 4, the signal generator includes first, second and third signal generating means 50, 51, 52, a summing unit 53 and a phase shift unit 54. In use, first, second and third tones are generated by respective first, second and third signal generators 50, 51, 52. The generated tones form components of an amplitude modulated signal, these comprising a carrier component ($a_c \cos(\omega_c t + \phi_c)$), a lower sideband component ($a_m \cos((\omega_c - \omega_m)t + \phi_c)$) and an upper sideband component ($a_m \cos((\omega_c + \omega_m)t + \phi_c)$). The summing unit 53 sums the carrier and lower sideband to form the reference signal 'R' and the upper sideband is output as the calibration signal 'C', via the phase shift unit 54, which introduces a fixed phase shift to the upper sideband.

The first, second and third tones are placed at the lower end of the operational frequency range of the MPA arrangement 2 such that they are outside of the frequency range occupied by communications traffic. Alternatively, the tones can be placed at the upper end of the operating frequency or in another unused frequency band.

Figure 5:
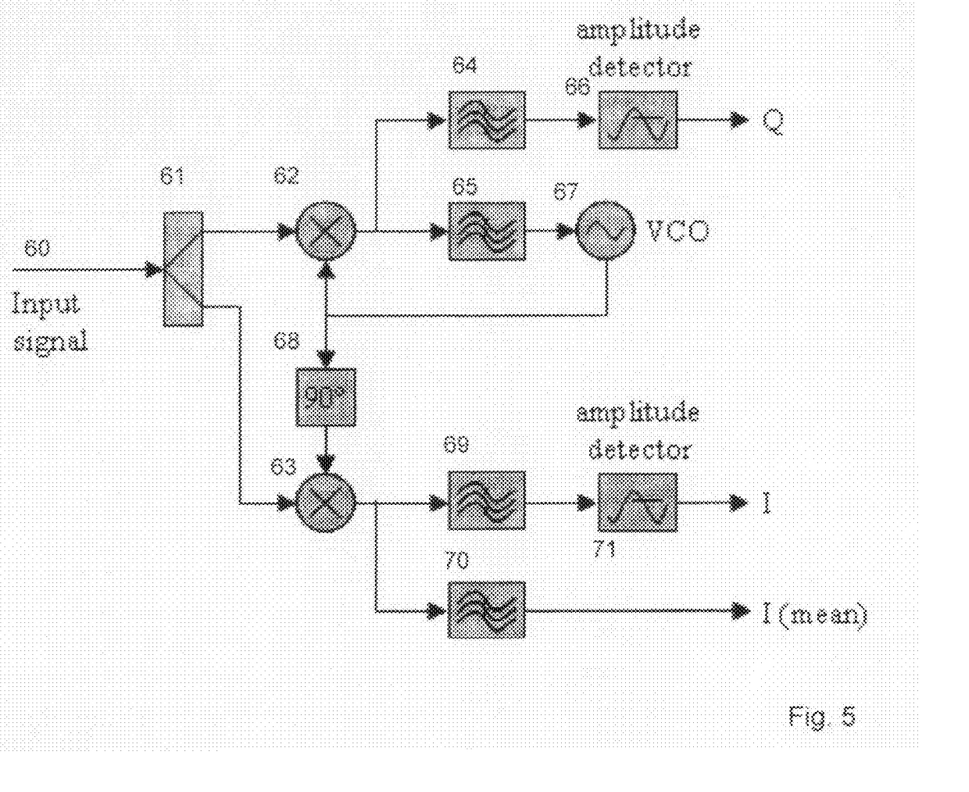
FIG. 5 schematically illustrates the functional architecture of a signal measurement unit forming part of the system illustrated in FIGS. 1 and 2, arranged to measure signals resulting from use of the switch unit and signal generator of FIGS. 3 and 4.

FIG. 5 schematically illustrates functional architecture of the signal measurement unit 5 forming part of the system illustrated in FIGS. 1 and 2.

Referring to FIG. 5, an input line 60 is connected to a signal splitter 61 having a first output connected to a first input of a first mixer 62 and a second output connected to a first input of a second mixer 63. The output of the first mixer 62 is provided to each of a first band-pass filter 64 and a first low pass filter 65. The output of the first band-pass filter 64 is provided to a first amplitude detector 66. The output of the first low-pass filter 65 is provided to a voltage controlled oscillator (VCO) 67, the output of which is connected to a second input of the first mixer 62.

The output of the voltage controlled oscillator 67 is also provided to a 90 degree phase shifter 68, the output of which is connected to a second input of the second mixer 63. The output of the second mixer 63 is provided to each of a second band-pass filter 69 and a second low pass filter 70, arranged in parallel. The output of the second band-pass filter 69 is provided to a second amplitude detector 71.

The measuring circuitry of the measurement unit 5 is essentially a coherent amplitude detector providing both in-phase (I) and quadrature (Q) outputs. The output of the first amplitude detector 66 provides a quadrature output (Q) and the output of the second amplitude detector 71 provides an in-phase output (I). Root mean squared values of the I and Q signals would preferably be measured, since these are more resilient to the effects of thermal noise. An average current output is also provided as the output of the second low-pass filter 70.

Although not illustrated, the measuring circuitry according to the present example would also include an anti-sideband-locking capability, used to prevent the detector from obtaining a false lock on one of the two sideband tones. Suitable anti-sideband-locking arrangements are well known in the art.

Figure 6:
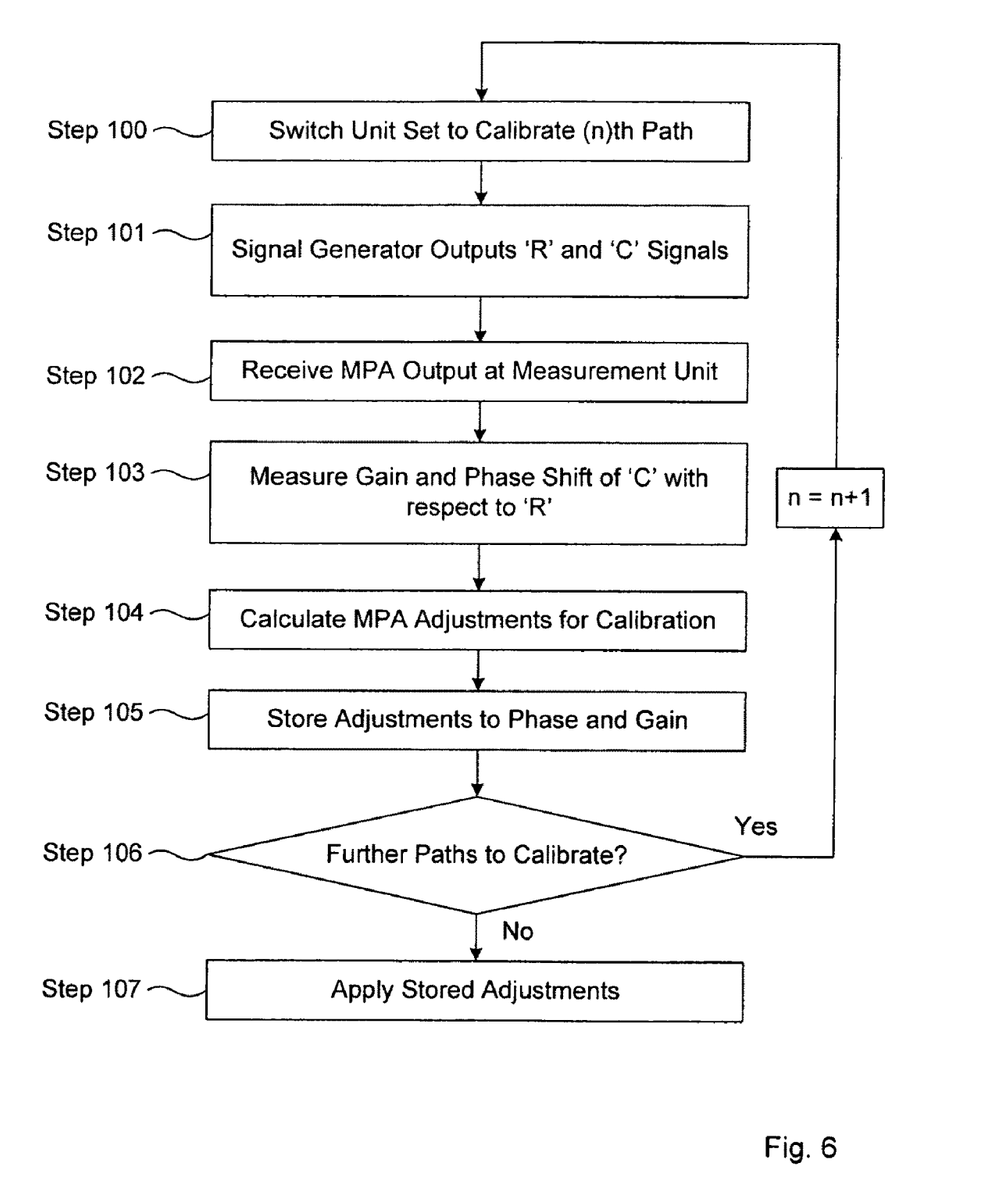
FIG. 6 is a flow diagram illustrating the steps performed according to an embodiment of the invention in determining parameter adjustments for a multiport amplifier.

FIG. 6 is a flow diagram illustrating in more detail the steps performed according to an embodiment of the invention in applying test signals to the MPA arrangement 2 and in determining parameter adjustments for the MPA arrangement 2 of the system 1 of FIG. 1, based on a measured output of the MPA 2.

Referring to FIG. 6, in an initial step, the switch unit 4 is set to calibrate the $n^{th}$ MPA path (step S100), where $1 \leq n \leq (N-1)$ and N is the number of ports of the MPA arrangement 2, in the present case four. For instance, to calibrate the '$2^{nd}$' path through the MPA arrangement 2 corresponding to the second amplifier 27b with respect to the '$1^{st}$' path corresponding to the first amplifier 27a, the first switch 40a of the switch unit 4 is closed such that the reference signal R is provided as the first output 42a from the signal generator 3 to the first INET output node 23a and the second switch 40b of the switch unit 4 is closed and the remaining third and fourth switches 40c, 40d are left open such that the calibration signal C is provided as the second output 42b from the signal generator 3 to the second INET output node 23b.

The signal generator 3 outputs the reference and calibration signals R, C simultaneously at its first and second test signal outputs 42a, 42b (step S101). The signal generator outputs R, C propagate through the adjustment units 25a-d, amplifiers 27a-d and ONET 28 and a combination of the reference and calibration signals is output from each of the ONET output ports 31a-d and is received at the signal measurement unit 5 (step S102).

The measurement unit 5 then measures the gain and phase-shift of the calibration signal 'C' with respect to the reference signal 'R' (step S103). The combination of the reference signal 'R' and the calibration signal 'C' at each ONET output port 31a-d creates the equivalent of a narrowband modulated signal at each port. With equal-amplitude sidebands, a pure amplitude modulated (AM) signal could be generated, or a pure narrowband phase modulated (PM) signal, depending upon the phasing of the sidebands with respect to the carrier component and each other. In the present example, the equivalent modulating signal is detected at the signal measurement unit 5 by demodulating the modulated RF signal provided at the ONET output port 31a. If the amplitude and/or phase of one sideband is modified relative to the other (as a result of the signals passing through the MPA), then the nature of the demodulated signal will change. A pure AM or PM signal, for example, will become some mix of amplitude modulation and phase modulation, this being evident in the outputs of the measuring unit 5.

Parameter adjustments are calculated at the adjustment calculation unit 6 based on the outputs of the measurement unit, so as to align the calibration path to the gain and phase characteristics of the reference path (step 104). In the present example, the parameters take into account the differential gain and phase shift introduced by the ONET 28 and those that will be introduced by the INET 20 in normal use, based on previously measured characteristic of the ONET 28 and INET 20. Alternatively, ideal rather than measured characteristics of these networks 20, 28 can be used. The INET 20 and ONET 28, in particular when implemented in waveguide, are considered to be stable and are calibrated by means of on-ground measurements during assembly, integration and testing (AIT). The adjustments are calculated, in embodiments of the invention, using an MPA emulator, which is used to emulate the gain and phase characteristics of the MPA to determine appropriate adjustments prior to applying the adjustments via the programmable amplitude and phase adjuster arrangement 24 onboard the satellite.

The resulting parameter adjustments for the particular calibration path are then stored in a memory (not shown) (step S105). It is determined whether further paths are to be calibrated (step S106). For instance, in the present example, N–1 paths of an MPA are calibrated to a reference path of the MPA, therefore resulting in three paths requiring calibration for a 4-port MPA. If further paths are to be calibrated, the above-described steps (steps S100 to S105) are repeated for each of the further paths.

Once all of the required MPA paths have been calibrated, the stored gain and phase adjustments are retrieved from the memory and applied to the MPA arrangement 2 (step S107). In particular, the adjustments are transmitted from the command processor 7 via the telecommand channel 13 to the satellite 8, where they are received and applied to the onboard programmable amplitude and phase adjuster arrangement 24 to adjust the required gain and phase parameters. The gain and phase adjusters in the reference path, in the present example, remain fixed.

Figure 7:
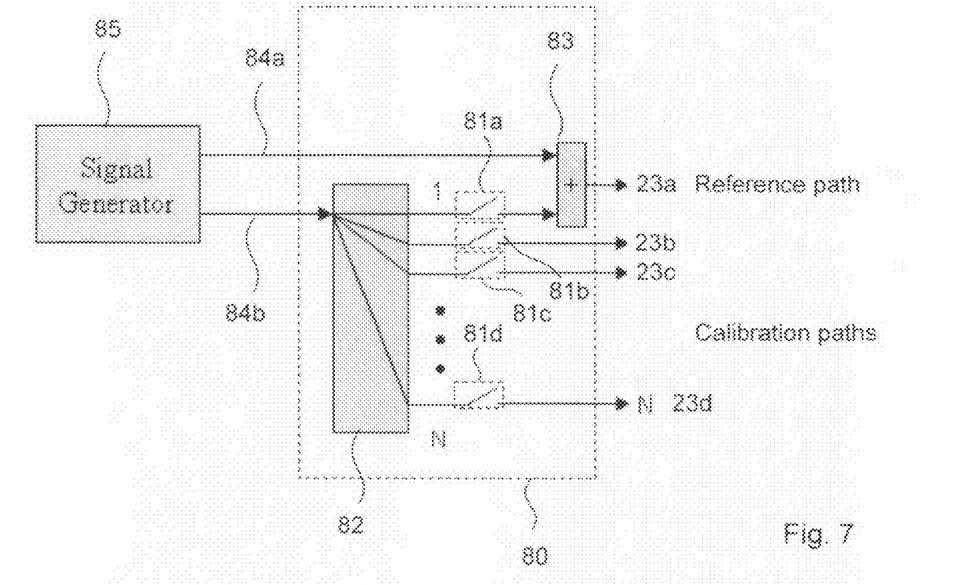
FIG. 7 schematically illustrates functional components of a switch unit forming part of the system of FIGS. 1 and 2, according to a further embodiment of the invention.

FIG. 7 schematically illustrates functional components of a further switch unit 80 which can be used in place of the switch unit 4 forming part of the system of FIGS. 1 and 2, according to a further embodiment of the invention.

Referring to FIG. 7, the further switch unit 80 includes first, second, third and N$^{th}$ switches 81a-d, where N is the number of ports of the MPA arrangement 2. In the present example in which a 4-port MPA is used having four INET output nodes 23a-d, first to fourth switches 81a-d are provided. The further switch unit 80 also includes a signal splitter 82 capable of providing an input signal to each of N outputs, the outputs connected to an input of each of the respective first to fourth switches 81a-d. The further switch unit 80 also includes a summing unit 83.

In use, a first output from a further signal generator 85 (described in more detail below), corresponding to a reference test signal 'R' is applied via a first connection 84a to the switch unit 80, and is applied to a first input of the summing unit 83. A second output from the further signal generator 85, corresponding to the calibration signal 'C', is applied via a second connection 84b to an input of the signal splitter 82. The output of the first switch 81a is connected to a second input of the summing unit 83 and the output of the summing unit 83 is provided to the first INET output node 23a. The outputs of the second, third and fourth switches 81b-d are connected to the respective second, third, fourth INET output nodes 23b-d.

Figure 8:
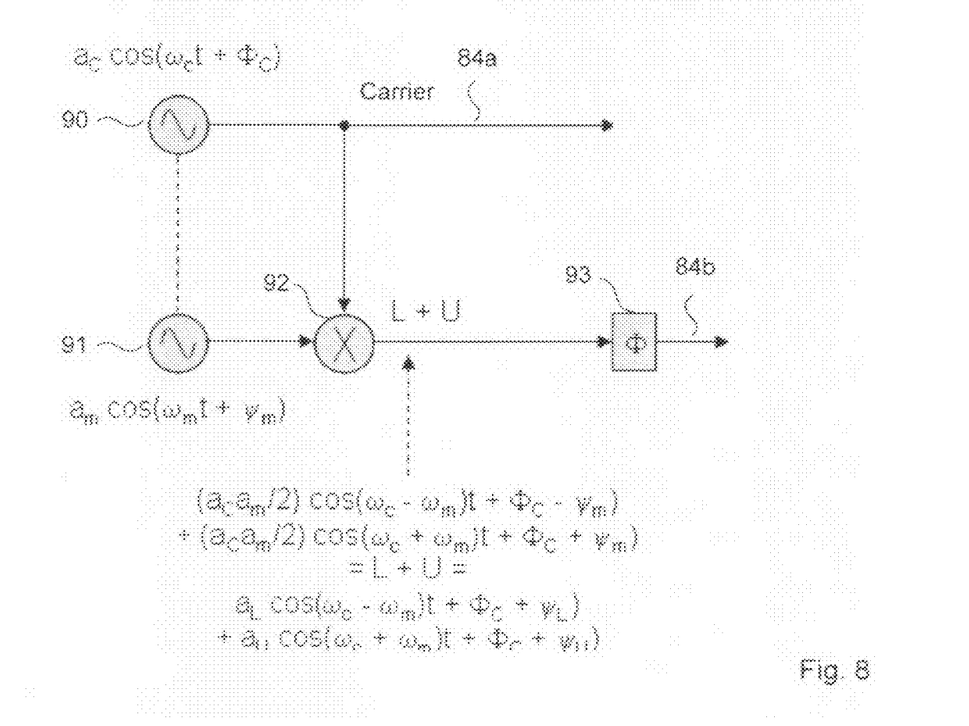
FIG. 8 schematically illustrates functional components of a signal generator forming part of the system illustrated in FIGS. 1 and 2 and arranged for use with the switch unit of FIG. 7, according to the further embodiment of the invention.

FIG. 8 schematically illustrates the components of the further signal generator 85 used to generate the reference and calibration signals according to the further embodiment of the invention.

Referring to FIG. 8, the further signal generator 85 includes first and second signal generating means 90, 91, a mixer 92 and a phase shift unit 93.

In use, first and second signals are generated by the respective first and second signal generating means 90, 91. The generated signals comprise a carrier component ($a_c \cos(\omega_c t + \phi_c)$) generated by the first signal generating means 90, and a message waveform component ($a_m \cos(\omega_m t + \psi_m)$) generated by the second signal generating means 91. The carrier component is provided as the reference signal 'R' at a first output on the first connection 84a to the further switch unit 80 and both components are provided as respective inputs to the mixer 92 which generates upper 'U' and lower 'L' modulation signals as $a_L \cos(\omega_c - \omega_m)t + \phi_c + \psi_L(L) + a_U \cos(\omega_c + \omega_m)t + \phi_c + \psi_U(U)$ at its output. The output of the mixer 92 is provided as an input to the phase shift unit 93. The output of the phase shift unit 93 provides the calibration signal 'C' as a second output on the second connection 84b to the further switch unit 80.

The reference and calibration signals R, C according to the further embodiment of the invention are placed at the lower end of the operational frequency range of the MPA arrangement 2 such that they are outside of the frequency range occupied by communications traffic. Alternatively, the signals can be placed at the upper end of the operating frequency or in another unused frequency band.

Figure 9:
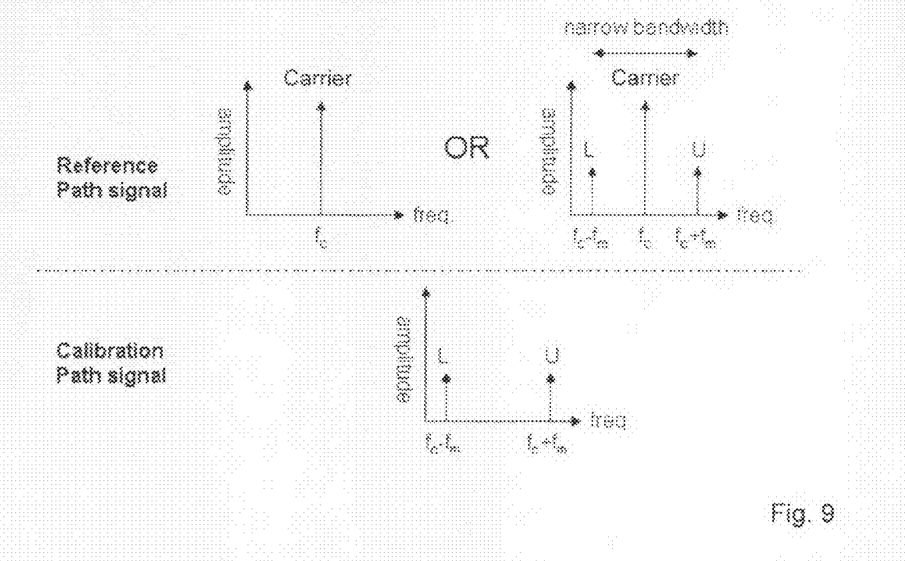
FIG. 9 graphically illustrates the signals generated by the signal generator of FIG. 8.

FIG. 9 graphically illustrates the signals generated by the further signal generator of FIG. 8 when used in conjunction with the further switch unit of FIG. 7.

Referring to FIG. 9, to calibrate the MPA arrangement 2, a two-phase test sequence is performed. In a first phase of the test sequence, the carrier signal component and the upper and lower sideband signals U, L are output from the signal generator 85 as the reference and calibration signals R, C. The first switch 81a of the further switch unit 80 is closed and the remaining switches 81b-d are left open such that combined carrier and upper and lower sideband signals U, L are applied to the reference path of the MPA arrangement, in the present case the path between the first INET output node 23a and the first ONET output port 31a.

In a second phase of the test sequence, the carrier signal component and the upper and lower sideband signals U, L are again output from the signal generator 85 as the reference and calibration signals R, C. However, in this case, the first switch 81a of the further switch unit 80 is open and each of the remaining switches 81b-d is closed in turn (while the others are left open) such that the carrier component is provided to the reference path of the MPA arrangement 2, in the present case the path between the first INET output node 23a and the first ONET output port 31a, and the upper and lower sideband signals U, L are applied to the calibration path of the MPA arrangement, for instance the path between the second INET output node 23b and the first ONET output port 31a. The one of the remaining switches 81b-d of the further switch unit 80 which is closed at any time will specify the path through the MPA arrangement 2 which is to be calibrated at that time.

Figure 10:
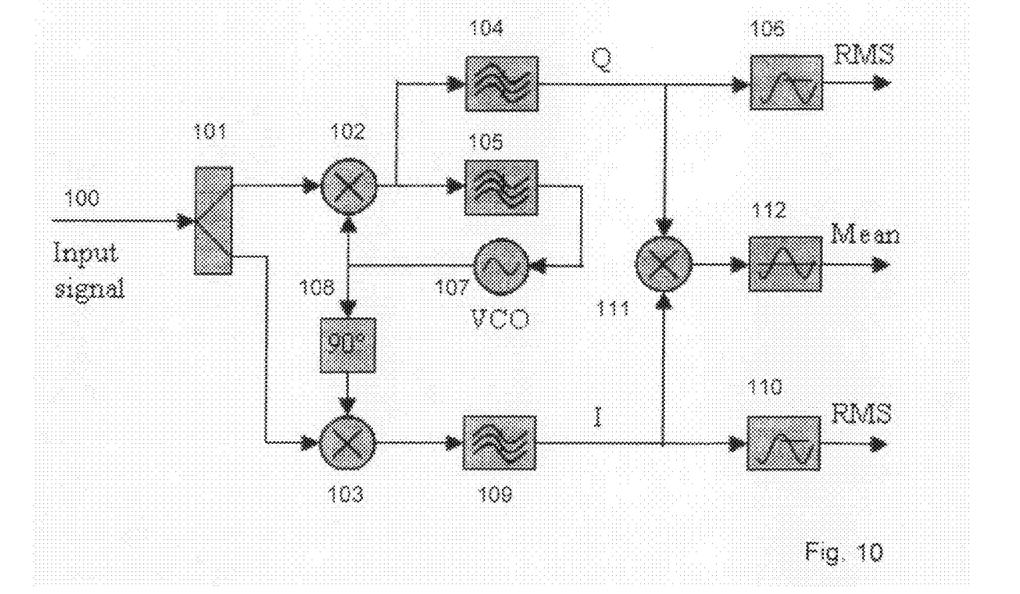
FIG. 10 schematically illustrates the functional architecture of a signal measurement unit forming part of the system illustrated in FIGS. 1 and 2, and arranged to measure signals resulting from use of the signal generator and switch unit of FIGS. 7 and 8 according to the further embodiment of the invention.

FIG. 10 schematically illustrates the functional architecture of a further signal measurement unit according to the further embodiment of the invention, arranged to measure signals resulting from use of the further signal generator 85 and switch unit 80 of FIGS. 7 and 8. The further signal measurement unit demodulates the composite signal formed by the addition of the carrier, upper sideband and lower sideband signal components with a phase-locked receiver having the functional architecture illustrated in FIG. 10.

Referring to FIG. 10, an input line 100 is connected to a signal splitter 101 having a first output connected to a first input of a first mixer 102 and a second output connected to a first input of a second mixer 103. The output of the first mixer 102 is provided to each of a first band-pass filter 104 and a low pass filter 105. The output of the first band-pass filter 104 is provided to a first amplitude detector 106. The output of the low-pass filter 105 is provided to a voltage controlled oscillator (VCO) 107, the output of which is connected to a second input of the first mixer 102.

The output of the voltage controlled oscillator 107 is also provided to a 90 degree phase shifter 108, the output of which is connected to a second input of the second mixer 103. The output of the second mixer 103 is provided to a second band-pass filter 109, the output of which is provided to a second amplitude detector 110.

A third mixer 111 receives the outputs from the first and second band-pass filters 104, 109 and provides an output to an average amplitude detector 112.

The further measurement unit is essentially a coherent amplitude detector providing both in-phase (I) and quadrature (Q) outputs. An anti-sideband-locking capability (not shown) can be implemented in order to prevent the receiver from obtaining a false lock on one of the two sideband tones.

The principle of the further measurement unit is to measure the RMS amplitudes of the in-phase and quadrature components of the demodulated signal and the mean of the product of the in-phase and quadrature components and to use these to determine the gain and phase offsets of the calibration path with respect to the reference path. The combination of the carrier and upper and lower signal components at each OMUX output port 31a-d creates the equivalent of a narrow-band modulated signal. With equal-amplitude sidebands, a pure amplitude modulated (AM) signal could be generated, or a pure narrowband phase modulated (PM) signal, depending upon the phasing of the sidebands with respect to the carrier component and with respect to each other. The method can be implemented for any arbitrary signal modulation conditions (i.e. the test signal need not represent a pure AM or PM signal, or even comprise equal-level sidebands).

Accordingly, during the second phase of the test sequence, if the amplitude and/or phase of the upper and/or lower sidebands U, L, is modified relative to the carrier (as a result of the upper and lower sideband signals passing through a calibration path of the MPA rather than a reference path), then the nature of the demodulated signal will change. In particular, a pure AM or PM signal, for example, will become some mix of amplitude modulation and phase modulation. Furthermore, any difference in the amplitude of the upper and lower sidebands when transmitted in the first phase of the test sequence when compared to the amplitudes in the second phase can be used to determine the relative gains of the reference and calibration paths, since the upper and lower sidebands are transmitted via the reference path in the first phase and via the calibration path in the second phase.

Figure 11:
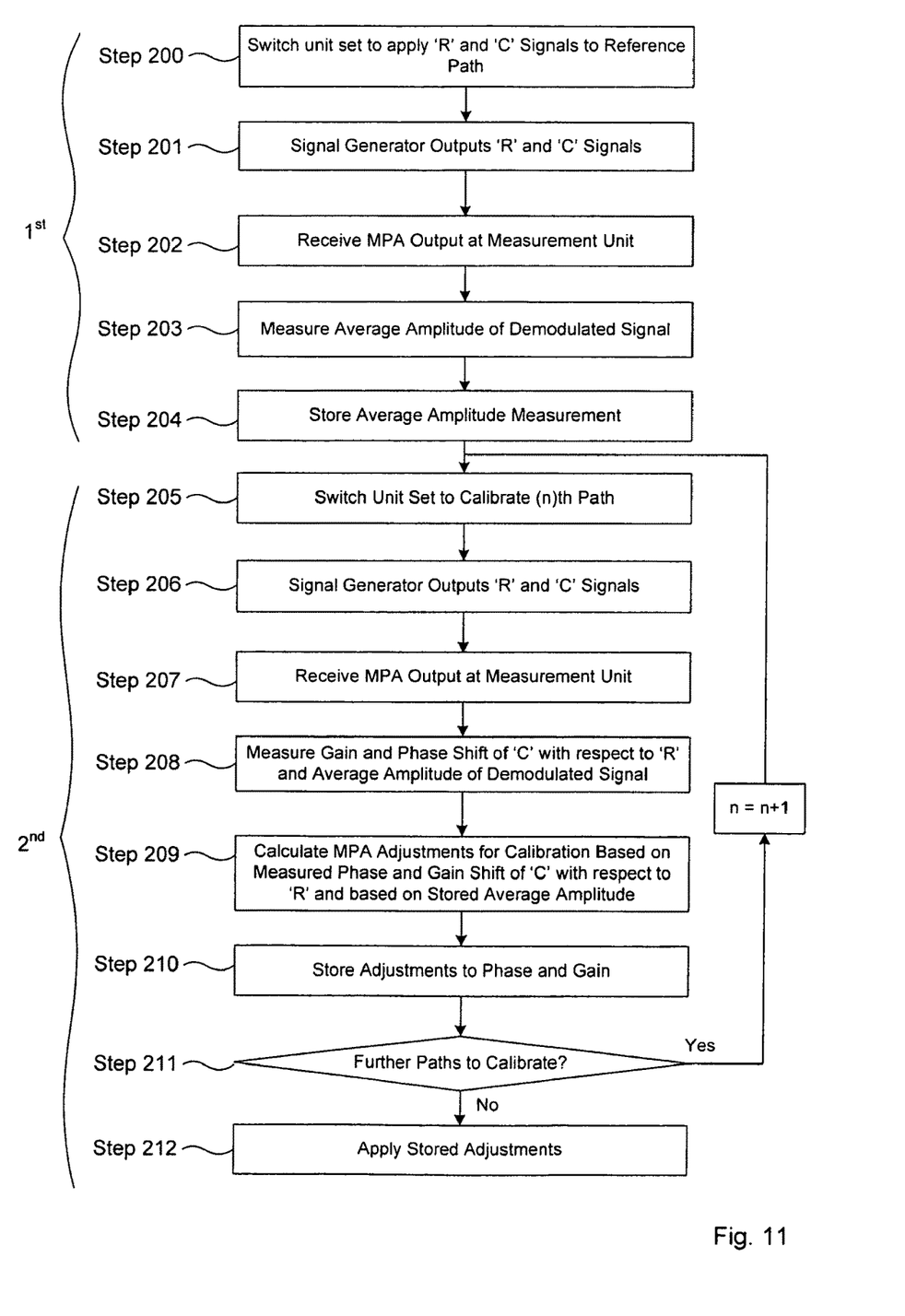
FIG. 11 is a flow diagram illustrating the steps performed according to a further embodiment of the invention in determining parameter adjustments for a multiport amplifier.

FIG. 11 is a flow diagram illustrating in more detail the steps performed according to the further embodiment of the invention in applying test signals to the MPA arrangement 2 and in determining parameter adjustments for the MPA arrangement 2 of the system 1 of FIG. 1, based on a measured output of the MPA 2.

Referring to FIG. 11, in an initial step of the first phase of the test sequence, the further switch unit 80 is set to apply the reference and calibration signals to the reference path, as described above with reference to FIG. 7. The further signal generator 85 outputs the reference and calibration signals R, C simultaneously at its first and second test signal outputs 84a, 84b (step S201). The signal generator outputs R, C propagate through the adjustment units 25a-d, amplifiers 27a-d and ONET 28 and a combination of the reference and calibration signals is output from each of the ONET output ports 31a-d and is received at the further signal measurement unit (step S202). The further signal measurement unit measures the average amplitude of the demodulated signal based on the output from the mean amplitude detector 112 (step 203) and stores the resulting average amplitude measurement (step 204).

In an initial step of the second phase of the test sequence, the further switch unit 80 is set to calibrate the $n^{th}$ MPA path (step S205), where $1 \leq n \leq (N-1)$ and N is the number of ports of the MPA arrangement 2, in the present case four. For instance, to calibrate the '$2^{nd}$' path through the MPA arrangement 2 corresponding to the second amplifier 27b with respect to the '$1^{st}$' path corresponding to the first amplifier 27a, the first switch 81a of the further switch unit 80 is opened and the second switch 81b is closed, such that the reference signal R is provided as the first output 84a from the further signal generator 85 to the first INET output node 23a and the calibration signal C is provided as the second output 84b from the further signal generator 85 to the second INET output node 23b.

The further signal generator 85 outputs the reference and calibration signals R, C simultaneously at its first and second test signal outputs 84a, 84b (step S206). The signal generator outputs R, C propagate through the adjustment units 25a-d, amplifiers 27a-d and ONET 28 and a combination of the reference and calibration signals is output from each of the ONET output ports 31a-d and is received at the further signal measurement unit (step S207).

The further measurement unit then measures the gain and phase-shift of the calibration signal 'C' with respect to the reference signal 'R' and the average amplitude of the demodulated signal (step S208). The combination of the reference signal 'R' and the calibration signal 'C' at each ONET output port 31a-d creates the equivalent of a narrowband modulated signal at each port. With equal-amplitude sidebands, a pure amplitude modulated (AM) signal could be generated, or a pure narrowband phase modulated (PM) signal, depending upon the phasing of the sidebands with respect to the carrier component and each other. In the present example, the equivalent modulating signal is detected at the further signal measurement unit by demodulating the modulated RF signal provided at the ONET output port 31a. If the amplitude and/or phase of the sidebands is modified relative to the carrier (as a result of the signals passing through the MPA), then the nature of the demodulated signal will change. A pure AM or PM signal, for example, will become some mix of amplitude modulation and phase modulation, this being evident in the RMS outputs of the further measuring unit.

The average amplitude of the demodulated signal is calculated in both the first phase of the test sequence when the upper and lower signal components take the reference path and in the second phase when the upper and lower components take the calibration path. In this manner, differences between the amplitudes of the upper and lower signal components resulting from the calibration path can be determined. Accordingly, any significant gain or phase slope on the downlink transmission path will not effect the measurement accuracy. The further embodiment of the invention is not therefore sensitive to transmission path gain and phase slopes, since these will affect the reference and calibration path measurements equally and their effects will be removed when calculating the relative gain and phase offsets.

Parameter adjustments are calculated at the adjustment calculation unit 6 based on the outputs of the further measurement unit, so as to align the calibration path to the gain and phase characteristics of the reference path (step 209). In the present example, the parameters take into account the differential gain and phase shift introduced by the ONET 28 and those that will be introduced by the INET 20 in normal use, based on previously measured characteristic of the ONET 28 and INET 20. Alternatively, ideal rather than measured characteristics of these networks 20, 28 can be used. The INET 20 and ONET 28, in particular when implemented in waveguide, are considered to be stable and are calibrated by means of on-ground measurements during assembly, integration and testing (AIT).

The resulting parameter adjustments for the particular calibration path are then stored in a memory (not shown) (step S210). It is determined whether further paths are to be calibrated (step S211). For instance, in the present example, N−1 paths of an MPA are calibrated to a reference path of the MPA, therefore resulting in three paths requiring calibration for a 4-port MPA. If further paths are to be calibrated, the above-described steps of the second phase of the test sequence (steps S205 to S211) are repeated for each of the further paths.

Once all of the required MPA paths have been calibrated, the stored gain and phase adjustments are retrieved from the memory and applied to the MPA arrangement 2 (step S212). In particular, the adjustments are transmitted from the command processor 7 via the telecommand channel 13 to the satellite 8, where they are received and applied to the on-board programmable amplitude and phase adjuster arrangement 24 to adjust the required gain and phase parameters. The gain and phase adjusters in the reference path, in the present example, remain fixed.

In the examples of the invention described above, for simplicity, certain components of the MPA arrangement have been omitted from the drawings, although the implementation of such features would be readily apparent to those skilled in the art. For instance, in practice, there would be a switch network that implements input redundancy switching for the amplifiers of the MPA. This network would be located between the INET and the inputs to the gain and phase adjusters. The reference and calibration signals are accordingly injected at the inputs to this switch network so that any differential gain and phase shift added when reconfiguring the switch network falls within the reference and calibration signal path and can be measured. Low pass filters (which could optionally be placed outside of the MPA), circulators and loads located at the amplifier outputs as well as other elements within the MPA are also omitted from the diagrams and description. However, the system design is such that these elements lie within the reference and calibrated signal paths and hence their performance is taken into account in the calibration.

Advantageously, the test signal generator 15 could also function as an earth station antenna tracking beacon generator (without the modulation sidebands). For satellite implementations that already require a tracking beacon the on-board cost of the calibration function becomes the incremental cost of the increased equipment complexity (with respect to a standard beacon generator).

Furthermore, additionally or alternatively, the on-ground measurement circuitry could be engineered as a modified version of a commercial satellite beacon receiver used for earth station antenna tracking purposes. Such receivers have anti-sideband-locking features so that they are able to employ the telemetry signal for antenna tracking. It could be sufficient for the receiver to provide raw I and Q outputs, with the filtering and amplitude detection operations being performed externally. In this case, the parameters of the test signal (sideband frequency offsets and relative power levels) would need to be constrained to be compatible with the design of the beacon receiver.

It would also be possible to implement the measurement system with a standard spectrum analyser complemented by software to control the measurement and to obtain and process the measurement results.

The features of the invention described above are described only as part of exemplary embodiments of the invention, and are not limited to being implemented in the described manner.

For instance, although a 4-port MPA arrangement 2 has been described, the invention is also applicable to MPAs having other numbers of ports, for instance 8×8 MPAs, 16×16 MPAs etc.

Also, although the signal measurement unit 5 is described as being provided at a ground station, the signal measurement unit 5 could be provided elsewhere, for instance at another ground location suitable for receiving a satellite downlink channel 21. The output signal from the MPA arrangement 2 may, for instance, be measured at various ground locations where the satellite transmits multiple downlink beams. However, in certain arrangements there may be some interference between co-frequency, co-polar beams that will restrict the locations where the measurements can be made. In a multi-beam system measurements may only be possible in the region of the beam centre for some beams, depending upon the frequency reuse scheme. Gateway earth stations provide a suitable location for the signal processing unit 20 since they are likely to be placed close to the beam centre and would therefore be convenient hosts for the measurement unit 21.

The signal measurement unit 5 and adjustment calculation unit 6 could be physically located on-board the satellite 8, although it is desirable in terms of minimising the equipment and power requirements of the satellite 8 for the units 5, 6 to be located on the ground. If the signal measurement unit 5 is implemented on board the satellite 8, paths from the MPA output(s) 31a-d to the signal measurement input(s) can be partially or fully gain and phase-matched, including any associated intermediate switching. The precise requirements for path alignment will depend upon the details of the selected calibration scheme.

In the present example, the decision to calibrate the MPA arrangement 2 is taken by an operator based on information on the MPA performance supplied by the command processor. However, in alternative embodiments, this decision can be taken automatically, i.e. without operator assistance or intervention.

The command processor 7, although described as being implemented at the ground station 9, could alternatively be implemented on-board the satellite 8. However, as for the signal measurement unit 5 and adjustment calculation unit 6, it is desirable in terms of minimising the equipment and power requirements of the satellite 8 for it to be located on the ground. In practice, the functions of the command processor 7 can be integrated into the on-ground payload control facilities of a satellite control centre.

The signal generator 3, although described as being implemented on-board the satellite 8, could alternatively be implemented on the ground together with the MPA 2, for instance during testing of the MPA 2 prior to launch of a satellite on which it is to be employed. The present invention can have significant advantages over known MPA testing and adjustment arrangements carried out on the ground by minimising the number of tests required and enabling the accurate measurement of output signals at a location other than the specific location of the MPA. For instance, during testing of satellite components such as MPAs within an environmental chamber, it is advantageous to locate measurement and testing equipment outside the environmental chamber to reduce any influence of this equipment on the results of the tests. The present invention provides apparatuses and methods which enable the accurate measurement of the outputs of an MPA over a transmission link, such as a wireless transmission link, such that parameter adjustments for the MPA can be determined from a remote location, for instance outside an environmental test chamber, avoiding the requirement for test equipment to be located within the test chamber and also for wired communications links to be provided between components within the test chamber and those outside the chamber.

Since the calibration of each path through the MPA arrangement is independent of any other path, calibration, gain and phase shift adjustments do not necessarily need to be stored and applied simultaneously to multiple paths of the MPA.

Alternatively, the adjustments could be made individually following each path calibration. It is also possible that, in certain circumstances, only a single amplifier path in the MPA would require adjustment, and the present invention enables such adjustment to be made with a minimal number of measurements.

Although specific reference and calibration signals have been described, the method of the invention can be implemented for any arbitrary (but known) signal modulation conditions. For instance, the combined test signals 'R' and 'C' do not need to represent a pure AM or PM signal, or even comprise equal-level sidebands. Furthermore, it is not necessary that the test signals include the carrier component, which could be provided to the measurement circuitry separately.

Furthermore, alternative test signal generation schemes are possible. For instance, the absolute gain and phase shift values can be estimated, rather than the values relative to some reference path. This can, for instance, be achieved by adding a test signal measurement that uses a different reference path through the MPA, requiring N test signal measurements rather than N−1, for instance a sequence of eight measurements for an 8×8 MPA. This method has the advantage that errors due to gain and phase slopes of the downlink channel 23 can be reduced. Such errors can also be reduced by performing calibration measurements twice for each calibration path, with a different respective sideband component used in turn as the calibrating signal. The results can then be averaged.

The invention claimed is:

1. A method of applying test signals to a multiport amplifier arrangement so as to provide an output signal indicative of parameter adjustments for the multiport amplifier arrangement, the multiport amplifier arrangement comprising an input network, an amplifier unit and an output network, the method comprising:
   providing a first test signal directly to a first point in the multiport amplifier arrangement between an output of the input network and a respective input of the amplifier unit, and
   providing a second test signal, using a switch unit, directly to a second point in the multiport amplifier arrangement between one of each a plurality of further outputs of the input network and a respective further input of the amplifier unit.

2. A method according to claim 1, wherein the second test signal is provided to the second point in the multiport amplifier arrangement simultaneously to the first test signal being provided to the first point.

3. A method of determining parameter adjustments for a multiport amplifier arrangement in a communication system, the method comprising:
   applying a first and a second test signal according to the method of claim 1,
   receiving first and second output signals associated with an output of the output network of the multiport amplifier arrangement, the first output signal corresponding to a first signal path taken by the first test signal through the multiport amplifier arrangement and the second output signal corresponding to a second signal path taken by the second test signal through the multiport amplifier arrangement; and
   determining parameter adjustments for the multiport amplifier arrangement based on the first and second output signals.

4. A method according to claim 3, wherein the parameter adjustments are at least one selected from gain adjustments and phase adjustments of the amplifier arrangement.

5. A method according to claim 3, wherein the path of the first test signal through the multiport amplifier arrangement acts as a reference path and the path of the second test signal through the multiport amplifier arrangement acts as a calibration path, wherein the step of determining parameter adjustments comprises determining parameter adjustments for the calibration path through the multiport amplifier arrangement.

6. A method according to claim 5, further comprising determining values indicative of the gain and phase shift of the calibration path relative to the reference path.

7. A method according to claim 3, wherein the first and second test signals are tones.

8. A method according to claim 3, wherein the first test signal comprises the sum of a carrier component of an amplitude modulated signal and a first sideband component of the amplitude modulated signal and the second test signal comprises a second sideband component of the amplitude modulated signal.

9. A method according to claim 3, wherein the first test signal comprises a carrier component of an amplitude modulated signal and the second test signal comprises one or both sideband component of the amplitude modulated signal.

10. A method according to claim 3, further comprising applying said first and second test signals to the first point in the multiport amplifier arrangement in a first phase of a test sequence and wherein the first and second test signals are provided to the MPA at the first and second points in the multiport amplifier arrangement in a second phase of the test sequence.

11. A method according to claim 10, further comprising measuring the amplitude of said second output signal corresponding to said second test signal during the first phase of the test sequence.

12. A method according to claim 5, further comprising transmitting the output of the multiport amplifier arrangement over a communications channel of the communications system and receiving and analysing the transmitted output to determine parameter parameters for the calibration path through the multiport amplifier arrangement.

13. A method according to claim 12, wherein the communication system comprises a satellite communication system, the multiport amplifier arrangement is located onboard the satellite and the steps of receiving and analysing the transmitted output of the multiport amplifier are performed at a ground-based location.

14. Apparatus for applying test signals to a multiport amplifier arrangement so as to provide an output signal indicative of parameter adjustments for the multiport amplifier arrangement, the multiport amplifier arrangement comprising an input network, an amplifier unit and an output network, the apparatus comprising:
   a test signal applying unit arranged to provide a first test signal directly to a first point in the multiport amplifier arrangement between an output of the input network and a respective input of the amplifier unit and arranged to provide a second test signal directly to a second point in the multiport amplifier arrangement between a further output of the input network and a respective further input of the amplifier unit, the test signal applying unit comprising a switch unit arranged to provide said second test signal at a point between one of each of a plurality of further outputs of the input network and a respective further input of the amplifier unit.

15. Apparatus according to claim 14, wherein the test signal applying unit is arranged to apply the second test signal to the second point in the multiport amplifier arrangement simultaneously to the first test signal being provided to the first point.

16. Apparatus according to claim 14, arranged for use in a satellite communication system.

17. Apparatus according to claim 16, wherein the test signal applying unit includes an earth station antenna tracking beacon generator.

18. A system for determining parameter adjustments for a multiport amplifier arrangement arranged for use in a communication system, the multiport amplifier arrangement comprising an input network, an amplifier unit and an output network, the system comprising:
   an apparatus according to claim 14; and
   an adjustment calculation unit for determining parameter adjustments for the multiport amplifier arrangement based on an output of the multiport amplifier arrangement.

19. A system according to claim 18, further comprising:
   a signal measurement unit, wherein the signal measurement unit is arranged to receive and measure the first and second output signals and to provide an output to the adjustment calculation unit, and wherein the adjustment calculation unit is arranged to calculate the parameter adjustments based on the output from the signal measuring unit.

20. A system according to claim 19, wherein the signal measurement unit comprises at least one selected from an adapted commercial satellite beacon receiver and an adapted spectrum analyser.

21. Apparatus for determining parameter adjustments for a multiport amplifier arrangement in a satellite communication system, the apparatus comprising:
- a signal measuring unit for receiving from a satellite of the satellite communication system first and second output signals associated with an output of the multiport amplifier arrangement located on the satellite, the first output signal corresponding to a first test signal applied directly to a first point in the multiport amplifier arrangement between a first output of the input network and a first input of the amplifier unit and the second output signal corresponding to a second test signal applied directly to a second point in the multiport amplifier arrangement between a second output of the input network and a second input of the amplifier unit; and
- an adjustment calculation unit for determining parameter adjustments for the multiport amplifier arrangement based on the first and second output signals.

22. Apparatus for determining parameter adjustments for a multiport amplifier arrangement located on a satellite in a communication system, the multiport amplifier arrangement comprising an input network, an amplifier unit and an output network, the apparatus comprising:
- a test signal applying unit for providing a first test signal directly to a first point in the multiport amplifier arrangement between a first output of the input network and a respective first input of the amplifier unit and for providing a second test signal directly to a second point in the multiport amplifier arrangement between a second output of the input network and a respective second input of the amplifier unit, and the apparatus is configured to transmit an output of the multiport amplifier arrangement over a communication channel of the communication system to a remote location for parameter adjustments for the multiport amplifier arrangement to be determined at the remote location based on the transmitted output.

23. A method of determining parameter adjustments for a multiport amplifier arrangement on a satellite in a communication system, the multiport amplifier arrangement comprising an input network, an amplifier unit and an output network, the method comprising:
- providing a first test signal directly to a first point in the multiport amplifier arrangement between a first output of the input network and a respective first input of the amplifier unit; and
- providing a second test signal directly to a second point in the multiport amplifier arrangement between a second output of the input network and respective second input of the amplifier unit;
- transmitting an output of the multiport amplifier arrangement over a communication channel of the communication system to a ground-based location for parameter adjustments for the multiport amplifier arrangement to be determined at the ground-based location based on the transmitted output.

24. A method of determining parameter adjustments for a multiport amplifier arrangement in a communication system, the multiport amplifier arrangement comprising an input network, an amplifier unit and an output network, the method comprising:
- receiving, at a ground-based location, first and second output signals associated with an output of a multiport amplifier arrangement located on a satellite, the first output signal corresponding to a first test signal applied directly to a first point in the multiport amplifier arrangement between a first output of the input network and a first input of the amplifier unit and the second output signal corresponding to a second test signal applied directly to a second point in the multiport amplifier arrangement between a second output of the input network and a second input of the amplifier unit; and
- determining parameter adjustments for the multiport amplifier arrangement based on the first and second output signals.

* * * * *